United States Patent
Niki

(10) Patent No.: US 10,468,081 B2
(45) Date of Patent: Nov. 5, 2019

(54) SEMICONDUCTOR STORAGE DEVICE

(71) Applicant: TOSHIBA MEMORY CORPORATION, Minato-ku, Tokyo (JP)

(72) Inventor: Yusuke Niki, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/907,745

(22) Filed: Feb. 28, 2018

(65) Prior Publication Data
US 2019/0066744 A1 Feb. 28, 2019

(30) Foreign Application Priority Data

Aug. 22, 2017 (JP) ................. 2017-159591

(51) Int. Cl.
| | |
|---|---|
| *G11C 8/10* | (2006.01) |
| *G11C 7/06* | (2006.01) |
| *G11C 8/14* | (2006.01) |
| *G11C 5/14* | (2006.01) |
| *G11C 7/18* | (2006.01) |
| *H03K 3/356* | (2006.01) |

(52) U.S. Cl.
CPC ............ *G11C 8/10* (2013.01); *G11C 5/147* (2013.01); *G11C 7/06* (2013.01); *G11C 7/18* (2013.01); *G11C 8/14* (2013.01); *H03K 3/356113* (2013.01)

(58) Field of Classification Search
CPC .. G11C 8/10; G11C 8/14; G11C 5/147; G11C 7/06; G11C 7/18; H03K 3/356113

USPC ..................................................... 365/189.02
See application file for complete search history.

(56) References Cited

U.S. PATENT DOCUMENTS

| | | | | |
|---|---|---|---|---|
| 6,650,565 | B1 * | 11/2003 | Ohsawa ................ | G11C 11/404 365/185.05 |
| 8,599,623 | B1 * | 12/2013 | Clark .................. | G11C 29/1201 365/189.02 |
| 2001/0028598 | A1 * | 10/2001 | Balluchi .............. | G11C 7/1021 365/230.06 |
| 2002/0097609 | A1 * | 7/2002 | Shiga ................... | G11C 7/1021 365/189.02 |
| 2003/0128581 | A1 * | 7/2003 | Scheuerlein ........... | G11O 5/025 365/185.03 |

(Continued)

FOREIGN PATENT DOCUMENTS

| | | |
|---|---|---|
| JP | 2014-220325 A | 11/2014 |
| JP | 2014-229333 A | 12/2014 |

*Primary Examiner* — Sung Il Cho
(74) *Attorney, Agent, or Firm* — Foley & Lardner LLP

(57) ABSTRACT

A device includes a memory-cell array and a sense-amplifier. A decoder connects a first BL to the sense amplifier. The decoder includes first and second multiplexers. The first multiplexer includes a first n-type transistor and a first p-type transistor. The first n-type transistor is connected to the first BL and capable of applying a first voltage for writing a first logic or a non-select voltage for not writing data to the first BL. The first p-type transistor is connected to the first BL and capable of applying a second voltage for writing a second logic or the non-select voltage to the first BL. The second multiplexer is connected between the first multiplexer and the sense amplifier and transmits the first voltage or the non-select voltage to the first n-type transistor and transmits the second voltage or the non-select voltage to the first p-type transistor.

12 Claims, 5 Drawing Sheets

(56) References Cited

U.S. PATENT DOCUMENTS

| | | | |
|---|---|---|---|
| 2004/0100852 A1* | 5/2004 | Scheuerlein | G11O 5/025 365/230.06 |
| 2004/0240283 A1* | 12/2004 | Tellier | G11C 29/00 365/200 |
| 2006/0062061 A1* | 3/2006 | Suh | G11C 7/12 365/203 |
| 2006/0077746 A1* | 4/2006 | Sivero | G11C 8/10 365/230.06 |
| 2006/0268626 A1* | 11/2006 | Hamzaoglu | G11O 5/14 365/189.04 |
| 2008/0123461 A1* | 5/2008 | Kim | G11O 5/025 365/230.03 |
| 2010/0091581 A1* | 4/2010 | Van Winkelhoff | G11C 7/1048 365/189.05 |
| 2011/0149667 A1* | 6/2011 | Hamzaoglu | G11C 11/412 365/203 |
| 2011/0205801 A1* | 8/2011 | Shiga | G11C 16/0483 365/185.18 |
| 2011/0216573 A1* | 9/2011 | Abe | G11C 11/21 365/148 |
| 2012/0026779 A1* | 2/2012 | Ikegami | G11C 13/0002 365/148 |
| 2013/0016557 A1* | 1/2013 | Kim | G11C 13/0004 365/163 |
| 2013/0033929 A1* | 2/2013 | Kim | G11C 13/0004 365/163 |
| 2013/0223125 A1* | 8/2013 | DeBrosse | G11O 5/025 365/148 |
| 2013/0308365 A1* | 11/2013 | Smith | G11C 17/18 365/96 |
| 2014/0036599 A1* | 2/2014 | Mun | G11C 16/24 365/185.22 |
| 2015/0371708 A1* | 12/2015 | Pickering | G11C 8/14 711/105 |
| 2016/0141039 A1 | 5/2016 | Arakawa | |
| 2016/0172028 A1* | 6/2016 | Park | G11C 13/0026 365/148 |
| 2016/0196861 A1* | 7/2016 | Sugiyama | H01L 43/08 365/51 |
| 2016/0203860 A1* | 7/2016 | Ho | G11C 13/0002 365/148 |
| 2016/0225443 A1* | 8/2016 | Chou | G11C 13/0064 |
| 2016/0240264 A1* | 8/2016 | Hosono | G11C 16/3459 |
| 2017/0278556 A1* | 9/2017 | Antonyan | G11C 11/1655 |
| 2017/0345465 A1* | 11/2017 | Hsieh | G11C 7/065 |
| 2017/0345496 A1* | 11/2017 | Liu | G11C 11/161 |

* cited by examiner

SEMICONDUCTOR STORAGE DEVICE

CROSS REFERENCE TO RELATED APPLICATIONS

This application is based upon and claims the benefit of priority from the prior Japanese Patent Application No. 2017-159591, filed on Aug. 22, 2017, the entire contents of which are incorporated herein by reference.

FIELD

The embodiments of the present invention relate to a semiconductor storage device.

BACKGROUND

In recent years, the distance between adjacent bit lines has been considerably narrowed with downscaling of a semiconductor storage device. When the distance between bit lines is narrowed, the placement area of a decoder that selects a bit line also needs to be reduced correspondingly. Therefore, a reduction of the placement area of a multiplexer that selectively connects a bit line to a sense amplifier in a decoder is also demanded.

DETAILED DESCRIPTION

Embodiments will now be explained with reference to the accompanying drawings. The present invention is not limited to the embodiments.

A semiconductor storage device according to an embodiment includes a memory cell array. A plurality of bit lines are connected to the memory cell array. A plurality of word lines are connected to the memory cell array. A sense amplifier is configured to read data from memory cells in the memory cell array or write data to the memory cells via the bit lines. A decoder is configured to connect a first bit line selected from the bit lines to the sense amplifier. The decoder includes a first multiplexer and a second multiplexer. The first multiplexer includes a first n-type transistor and a first p-type transistor. The first n-type transistor is connected to the first bit line among the bit lines and configured to apply a first voltage for writing a first logic or a non-select voltage for not writing data to the first bit line. The first p-type transistor is connected to the first bit line and configured to apply a second voltage for writing a second logic or the non-select voltage to the first bit line. The second multiplexer is connected between the first multiplexer and the sense amplifier and configured to transmit the first voltage or the non-select voltage to the first n-type transistor and transmit the second voltage or the non-select voltage to the first p-type transistor.

Figure 1:
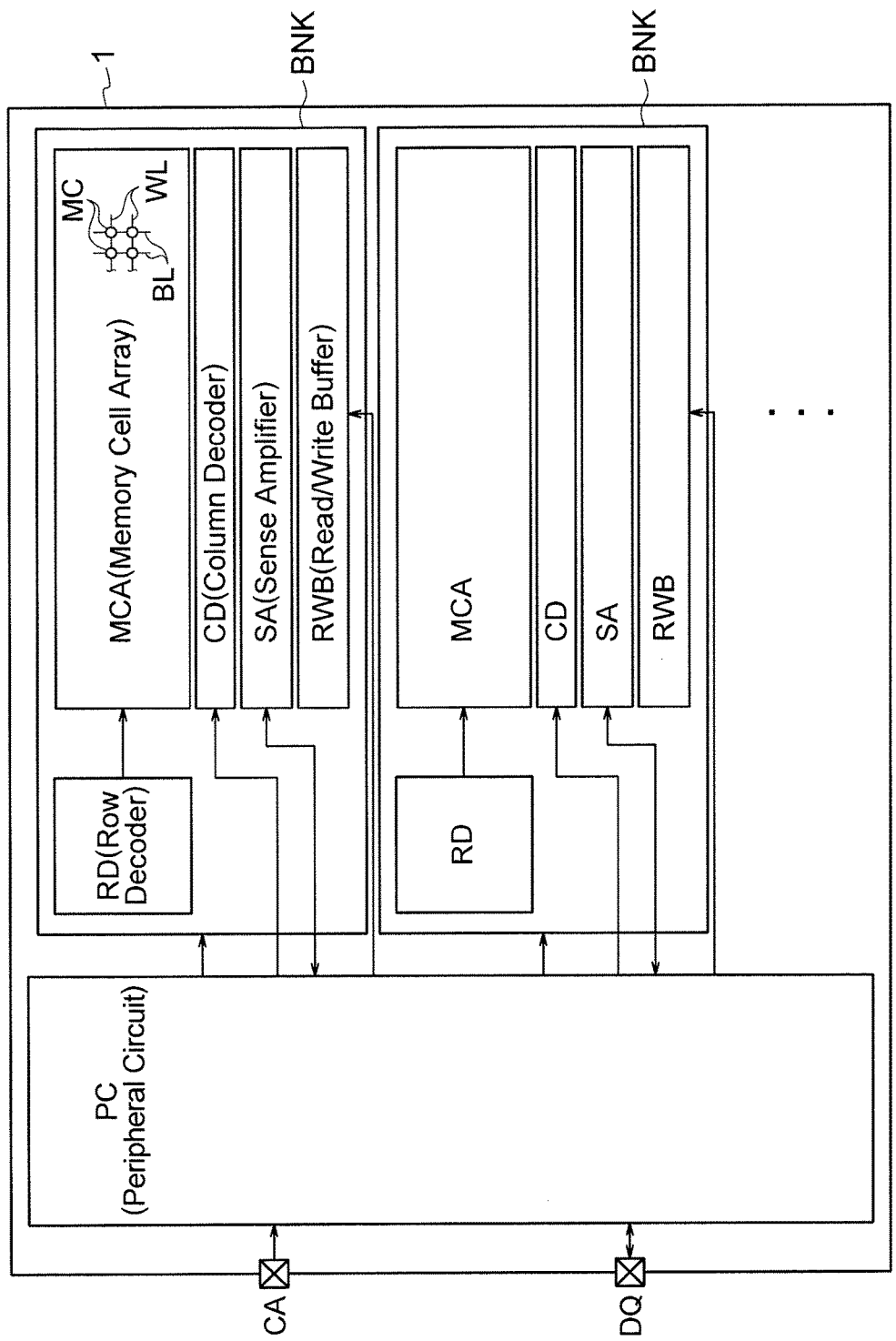
FIG. 1 is a block diagram illustrating a configuration example of a semiconductor storage device according to an embodiment.

FIG. 1 is a block diagram illustrating a configuration example of a semiconductor storage device according to an embodiment. A semiconductor storage device 1 can be, for example, a volatile memory such as a DRAM (Dynamic Random-Access Memory) or a non-volatile memory such as a NAND EEPROM (Electrically Erasable and Programmable Read-Only-Memory), a ReRAM (Resistive RAM), or an MRAM (Magnetoresistive RAM). The semiconductor storage device 1 can be alternatively, for example, one memory chip or a module such as a DIMM (Dual Inline Memory Module) including a plurality of memory chips.

The semiconductor storage device 1 illustrated in FIG. 1 is, for example, configured as one memory chip. The semiconductor storage device 1 is hereinafter referred to as "memory chip 1". The memory chip 1 includes a memory cell array MCA, a column decoder CD, a row decoder RD, a sense amplifier SA, a read/write buffer RWB, and a peripheral circuit PC.

The memory cell array MCA includes a plurality of memory cells MC arrayed two-dimensionally in a matrix manner, for example. The memory cells MC are, for example, ReRAMs. The memory cells MC are placed, for example, at intersections between bit lines BL and word lines WL. That is, the memory cell array MCA is a so-called cross-point memory cell array. When viewed from above or from the side of a semiconductor substrate, the bit lines BL are substantially orthogonal to the word lines WL. The bit lines BL are connected to one ends of corresponding memory cells MC of the memory cell array MCA. The word lines WL are connected to one ends of corresponding memory cells MC of the memory cell array MCA. The memory cell array MCA is divided into a plurality of banks BNK in one chip. A sense amplifier SA, a data latch DL, an address latch AL, and the like are provided for each bank BNK.

The sense amplifier SA is connected to the memory cells MC via the bit lines BL and applies a write voltage (VDD or VSS, for example) or a read voltage to the memory cells MC via the relevant bit lines BL, for example. The sense amplifier SA writes data to the memory cells MC by applying a write voltage to the memory cells MC or reads data from the memory cells MC by applying a read voltage to the memory cells MC.

The read/write buffer RWB temporarily holds data or an address detected by the sense amplifier SA with respect to each page, or temporarily holds data or an address to be written to the memory cell array MCA with respect to each page.

The row decoder RD and the column decoder CD access the memory cell array MCA based on a bank address or a page address and apply a write voltage or a read voltage to a word line WL or a bit line BL. The row decoder RD applies a write voltage or a read voltage to a selected word line that is selected from the word lines WL. The column decoder CD connects a selected bit line (first bit line) that is selected from the bit lines BL to the sense amplifier SA. The sense amplifier SA applies a write voltage or a read voltage to the selected bit line. This enables the memory chip 1 to write data to a desired memory cell MC in the memory cell array MCA or read data from a desired memory cell MC.

Although not illustrated in the drawings, the peripheral circuit PC includes, for example, a voltage generator, a read/write engine, an address controller, a command controller, and an input/output circuit.

The voltage generator generates voltages for the word lines WL and voltages for the bit lines BL required for a data read operation and a data write operation.

The read/write engine controls the column decoder CD and the row decoder RD to write data to a desired memory cell MC in the bank BNK or read data from a desired memory cell MC in the bank BNK in accordance with a command and an address. The read/write engine transfers the read data to a DQ buffer in the input/output circuit.

The address controller receives addresses such as a row address and a column address and decodes these addresses. The command controller receives commands indicating various operations such as a data read operation and a data write operation and transfers these commands to the read/write engine.

The input/output circuit (IO) takes in a command and an address from a CA terminal CA to transfer the command to the command controller and transfer the address to the address controller. The command can be a write command for instructing a write operation or a read command for instructing a read operation. The address can be a bank address indicating any of the banks BNK in the memory cell array MCA, and an address indicating a page or a memory cell MC being a read target or a write target in the bank BNK. When a plurality of banks BNK constitute one bank group, the address can be the address of a bank group.

The input/output circuit also takes in write data from a DQ terminal to transfer the write data to the read/write buffer RWB. Alternatively, the input/output circuit receives read data held in the data latch DL and outputs the read data from the DQ terminal.

A memory controller (not illustrated) can be provided outside the memory chip 1 to control the entirety of a plurality of memory chips 1.

Figure 2:
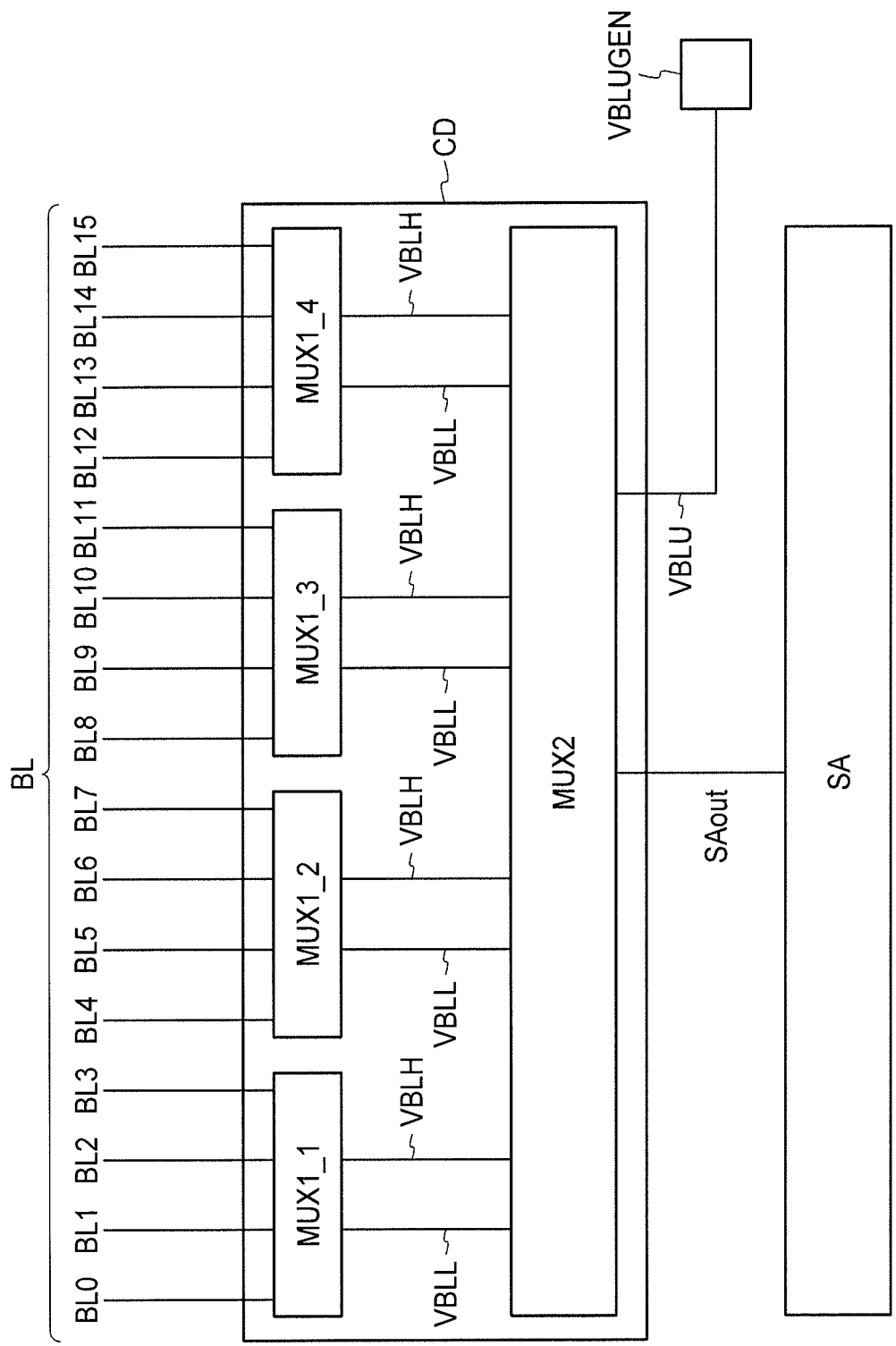
FIG. 2 is a block diagram illustrating a configuration example of the column decoder CD, the sense amplifier SA, and the bit lines BL.

FIG. 2 is a block diagram illustrating a configuration example of the column decoder CD, the sense amplifier SA, and the bit lines BL. The column decoder CD includes first multiplexers MUX1_1 to MUX1_4 and a second multiplexer MUX2.

In FIG. 2, the first multiplexer MUX1_1 is provided to correspond to four bit lines BL0 to BL3, the first multiplexer MUX1_2 is provided to correspond to four bit lines BL4 to BL7, the first multiplexer MUX1_3 is provided to correspond to four bit lines BL8 to BL11, and the first multiplexer MUX1_4 is provided to correspond to four bit lines BL12 to BL15. That is, each of the first multiplexers MUX1_1 to MUX1_4 is provided for four bit lines BL. However, each of the first multiplexers MUX1_1 to MUX1_4 can be provided to correspond to any number of bit lines BL.

The second multiplexer MUX2 is provided for the four first multiplexers MUX1_1 to MUX1_4 in FIG. 2. However, the second multiplexer MUX2 can be provided to correspond to any number of the first multiplexers MUX1_m (m is any natural number).

The first and second multiplexers MUX1_1 to MUX1_4 and MUX2 select one selected bit line (any one of BL0 to BL15) from the bit lines BL0 to BL15 and connect the selected bit line to the sense amplifier SA in one write operation or one read operation. The sense amplifier SA applies a write voltage to the selected bit line to write data thereto, or applies a read voltage to the selected bit line to read data therefrom. A plurality of units each including the multiplexers and the sense amplifier illustrated in FIG. 2 can be provided in the column decoder CD and the sense amplifier SA in FIG. 1

Figure 3:
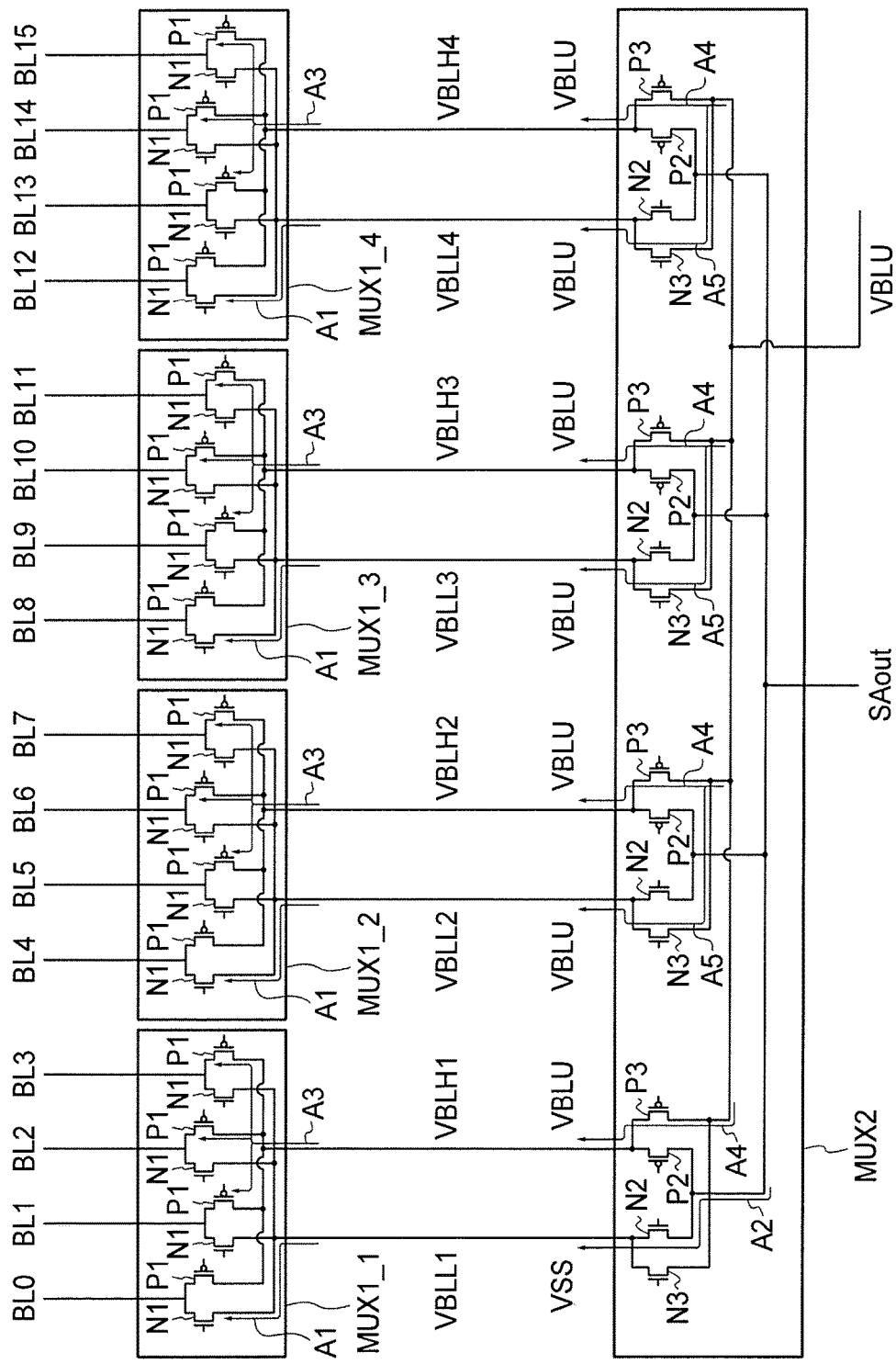
FIG. 3 is a circuit diagram illustrating a configuration example of the first multiplexers and the second multiplexer.

FIG. 3 is a circuit diagram illustrating a configuration example of the first multiplexers and the second multiplexer. Each of the first multiplexers MUX1_1 to MUX1_4 includes CMOS (Complementary Metal Oxide Semiconductor) pairs each including a first n-type transistor N1 and a first p-type transistor P1 and corresponding to a relevant one of the bit lines BL0 to BL15. That is, each of the first multiplexers MUX1_1 to MUX1_4 includes CMOS pairs as many as the bit lines BL corresponding thereto, respectively. In the present embodiment, each of the first multiplexers MUX1_1 to MUX1_4 includes four CMOS pairs, for example.

One ends of the four first n-type transistors N1 in the first multiplexer MUX1_1 are connected in common to a voltage line VBLL1 corresponding to the first multiplexer MUX1_1, and the other ends thereof are connected to the bit lines BL0 to BL3, respectively. One ends of the four first p-type transistors P1 in the first multiplexer MUX1_1 are connected in common to a voltage line VBLH1 corresponding to the first multiplexer MUX1_1, and the other ends thereof are connected to the bit lines BL0 to BL3, respectively.

One ends of the four first n-type transistors N1 in the first multiplexer MUX1_2 are connected in common to a voltage line VBLL2 corresponding to the first multiplexer MUX1_2, and the other ends thereof are connected to the bit lines BL4 to BL7, respectively. One ends of the four first p-type transistors P1 in the first multiplexer MUX1_2 are connected in common to a voltage line VBLH2 corresponding to the first multiplexer MUX1_2, and the other ends thereof are connected to the bit lines BL4 to BL7, respectively.

One ends of the four first n-type transistors N1 in the first multiplexer MUX1_3 are connected in common to a voltage line VBLL3 corresponding to the first multiplexer MUX1_3, and the other ends thereof are connected to the bit lines BL8 to BL11, respectively. One ends of the four first p-type transistors P1 in the first multiplexer MUX1_3 are connected in common to a voltage line VBLH3 corresponding to the first multiplexer MUX1_3, and the other ends thereof are connected to the bit lines BL8 to BL11, respectively.

One ends of the four first n-type transistors N1 in the first multiplexer MUX1_4 are connected in common to a voltage line VBLL4 corresponding to the first multiplexer MUX1_4, and the other ends thereof are connected to the bit lines BL12 to BL15, respectively. One ends of the four first p-type transistors P1 in the first multiplexer MUX1_4 are connected in common to a voltage line VBLH4 corresponding to the first multiplexer MUX1_4, and the other ends thereof are connected to the bit lines BL12 to BL15, respectively.

The second multiplexer MUX2 includes n-type MOS pairs each including a second n-type transistor N2 and a third n-type transistor N3 and corresponding to the voltage lines VBLL1 to VBLL4, respectively. That is, the second multiplexer MUX2 includes the n-type MOS pairs as many as the voltage lines VBLL1 to VBLL4 corresponding thereto, respectively. In the present embodiment, the second multiplexer MUX2 includes, for example, four n-type MOS pairs. One ends of the four second n-type transistors N2 in the second multiplexer MUX2 are connected in common to the sense amplifier SA, and the other ends thereof are connected to the voltage lines VBLL1 to VBLL4, respectively. One ends of the four third n-type transistors N3 in the second multiplexer MUX2 are connected in common to a non-select voltage generator VBLUGEN, and the other ends thereof are connected to the voltage lines VBLL1 to VBLL4, respectively.

The second multiplexer MUX2 also includes p-type MOS pairs each including a second p-type transistor P2 and a third p-type transistor P3 and corresponding to the voltage lines VBLH1 to VBLH4, respectively. That is, the second multiplexer MUX2 includes the p-type MOS pairs as many as the voltage lines VBLH1 to VBLH4 corresponding thereto, respectively. In the present embodiment, the second multiplexer MUX2 includes four p-type MOS pairs, for example. One ends of the four second p-type transistors P2 in the second multiplexer MUX2 are connected in common to the sense amplifier SA, and the other ends thereof are connected to the voltage lines VBLH1 to VBLH4, respectively. One ends of the four third p-type transistors P3 in the second multiplexer MUX2 are connected in common to the non-select voltage generator VBLUGEN, and the other ends thereof are connected to the voltage lines VBLH1 to VBLH4, respectively.

Figure 4:
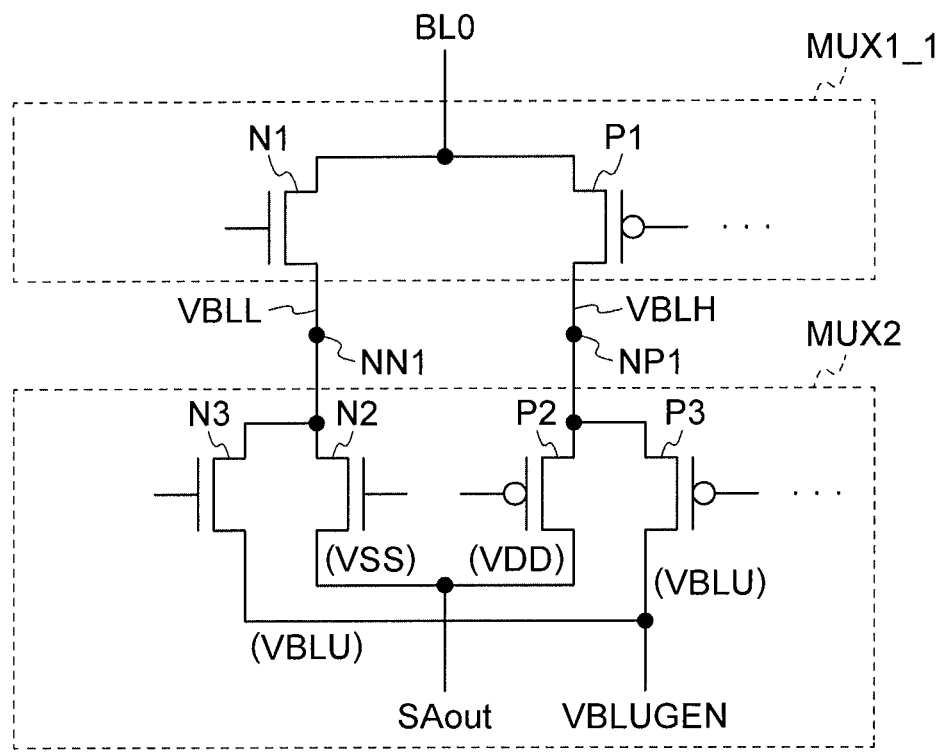
FIG. 4 is a circuit diagram illustrating a configuration of the CMOS pair in the first multiplexer MUX1_1 and the n-type MOS pair and the p-type MOS pair in the second multiplexer MUX2, all corresponding to the bit line BL0.

FIG. 4 is a circuit diagram illustrating a configuration of the CMOS pair in the first multiplexer MUX1_1 and the n-type MOS pair and the p-type MOS pair in the second multiplexer MUX2, all corresponding to the bit line BL0. Configurations corresponding to other bit lines BL1 to BL15, respectively, are identical to the configuration corresponding to the bit line BL0 as illustrated in FIG. 3. Therefore, a partial configuration of the first multiplexer MUX1_1 and the second multiplexer MUX2 corresponding to the bit line BL0 is explained below and explanations of the configurations corresponding to other bit lines BL1 to BL15 are omitted. A voltage used in a read operation is set to a voltage between a ground voltage VSS and a power-supply voltage VDD that are used in a write operation and is output from the sense amplifier SA. Accordingly, a write voltage having a relatively large voltage range is explained below. A voltage of the voltage line VBLL1 may be referred to as "bit line voltage VBLL" and a voltage of the voltage line VBLH1 may be referred to as "bit line voltage VBLH" for the sake of convenience.

The CMOS pair in the first multiplexer MUX1_1 includes the first n-type transistor N1 and the first p-type transistor P1. The first n-type transistor N1 is, for example, an n-type MOSFET (MOS Field Effect Transistor) and is connected between the bit line BL0 and a node NN1. A low-voltage-side bit line voltage VBLL is applied to the node NN1. The bit line voltage VBLL is the ground voltage VSS (0 volt, for example) as a first voltage for writing a first logic (data "0", for example), or a non-select voltage VBLU for not writing data. The non-select voltage VBLU is a voltage applied to non-selected bit lines other than a selected bit line, to which data write is not performed, and is set to be substantially equal to a voltage of non-selected word lines WL. This prevents a voltage difference to be easily applied to non-selected memory cells MC connected between the non-selected bit lines and the non-selected word lines and hardly degrades (disturbs) data in the non-selected memory cells MC.

The non-select voltage VBLU is an intermediate voltage between the ground voltage VSS and the power-supply voltage VDD being a second voltage and is, for example, a voltage of 0.2 VDD to 0.8 VDD when the ground voltage VSS is 0 volt. The non-select voltage VBLU is generated by the non-select voltage generator VBLUGEN. The non-select voltage generator VBLUGEN can be incorporated into the peripheral circuit PC or can be provided outside the memory chip 1.

The first p-type transistor P1 is, for example, a p-type MOSFET and is connected between the bit line BL0 and a node NP1. A high-voltage-side bit line voltage VBLH is applied to the node NP1. The bit line voltage VBLH is the power-supply voltage VDD being the second voltage for writing a second logic (data "1", for example) or the non-select voltage VBLU.

Respective gate electrodes of the first n-type transistor N1 and the first p-type transistor P1 are connected to the read/write engine, the address controller, and the command controller of the peripheral circuit PC. In a data write operation, complementary logics are input to the gate electrode of the first n-type transistor N1 and the gate electrode of the first p-type transistor P1, respectively. Therefore, in a data write operation, the first n-type transistor N1 and the first p-type transistor P1 operate complementarily with each other. That is, when the first n-type transistor N1 is in an on-state (a conduction state), the first p-type transistor P1 is in an off-state (a non-conduction state). Conversely, when the first p-type transistor P1 is in an on-state, the first n-type transistor N1 is in an off-state. Therefore, when the bit line BL0 is connected to the node NN1 via the first n-type transistor N1, the voltage of the bit line BL0 can be the ground voltage VSS as the bit line voltage VBLL or the non-select voltage VBLU. When the bit line BL0 is connected to the node NP1 via the first p-type transistor P1, the voltage of the bit line BL0 can be the power-supply voltage VDD as the bit line voltage VBLH or the non-select voltage VBLU.

The second multiplexer MUX2 includes the second n-type transistor N2, the third n-type transistor N3, the second p-type transistor P2, and the third p-type transistor P3. The second and third n-type transistors N2 and N3 constituting the n-type MOS pair are, for example, n-type MOSFETs. The second and third p-type transistors P2 and P3 constituting the p-type MOS pair are, for example, p-type MOSFETs.

The second n-type transistor N2 is connected between the first n-type transistor N1 and the sense amplifier SA and transmits a sense amplifier voltage SAout from the sense amplifier SA to the first n-type transistor N1 via the node NN1. While the sense amplifier voltage SAout can be the ground voltage VSS for writing the first logic or the power-supply voltage VDD for writing the second logic in a data write operation, the sense amplifier voltage SAout is set to the ground voltage VSS when the second n-type transistor N2 is in an on-state.

The third n-type transistor N3 is connected between the first n-type transistor N1 and the non-select voltage generator VBLUGEN and transmits the non-select voltage VBLU from the non-select voltage generator VBLUGEN to the first n-type transistor N1 via the node NN1.

Respective gate electrodes of the second n-type transistor N2 and the third n-type transistor N3 are connected to the read/write engine, the address controller, and the command controller of the peripheral circuit PC. In a data write operation, complementary logics are input to the gate electrode of the second n-type transistor N2 and the gate electrode of the third n-type transistor N3, respectively. Therefore, in a data write operation, the second n-type transistor N2 and the third n-type transistor N3 operate complementarily with each other. That is, when the second n-type transistor N2 is in an on-state, the third n-type transistor N3 is in an off-state. Conversely, when the third n-type transistor N3 is in an on-state, the second n-type transistor N2 is in an off-state. As described above, the sense amplifier voltage SAout is set to the ground voltage VSS when the second n-type transistor N2 is in an on-state. Therefore, when the node NN1 is connected to the sense amplifier SA via the second n-type transistor N2, the voltage of the node NN1 becomes the ground voltage VSS as the bit line voltage VBLL. On the other hand, when the node NN1 is connected to the non-select voltage generator VBLUGEN via the third n-type transistor N3, the voltage of the node NN1 becomes the non-select voltage VBLU as the bit line voltage VBLL.

In other words, the first and second n-type transistors N1 and N2 are connected in series between the bit line BL0 and the sense amplifier SA and transmit the ground voltage (low-level voltage) VSS as the bit line voltage VBLL to the bit line BL0. The first and third n-type transistors N1 and N3 are connected in series between the bit line BL0 and the non-select voltage generator VBLUGEN and transmit the non-select voltage VBLU as the bit line voltage VBLL to the bit line BL0.

The second p-type transistor P2 is connected between the first p-type transistor P1 and the sense amplifier SA and transmits the sense amplifier voltage SAout from the sense amplifier SA to the first p-type transistor P1 via the node NP1. While the sense amplifier voltage SAout can be the ground voltage VSS for writing the first logic or the power-supply voltage VDD for writing the second logic in a data write operation, the sense amplifier voltage SAout is set to the power-supply voltage VDD when the second p-type transistor P2 is in an on-state.

The third p-type transistor P3 is connected between the first p-type transistor P1 and the non-select voltage generator VBLUGEN and transmits the non-select voltage VBLU from the non-select voltage generator VBLUGEN to the first p-type transistor P1 via the node NP1.

Respective gate electrodes of the second p-type transistor P2 and the third p-type transistor P3 are connected to the read/write engine, the address controller, and the command controller of the peripheral circuit PC. In a data write operation, complementary logics are input to the gate electrode of the second p-type transistor P2 and the gate electrode of the third p-type transistor P3, respectively. Therefore, in a data write operation, the second p-type transistor P2 and the third p-type transistor P3 operate complementarily with each other. That is, when the second p-type transistor P2 is in an on-state, the third p-type transistor P3 is in an off-state. Conversely, when the third p-type transistor P3 is in an on-state, the second p-type transistor P2 is in an off-state. As described above, the sense amplifier voltage SAout is set to the power-supply voltage VDD when the second p-type transistor P2 is in an on-state. Therefore, when the node NP1 is connected to the sense amplifier SA via the second p-type transistor P2, the voltage of the node NP1 becomes the power-supply voltage VDD as the bit line voltage VBLH. On the other hand, when the node NP1 is connected to the non-select voltage generator VBLUGEN via the third p-type transistor P3, the voltage of the node NP1 becomes the non-select voltage VBLU as the bit line voltage VBLH.

In other words, the first and second p-type transistors P1 and P2 are connected in series between the bit line BL0 and the sense amplifier SA and transmit the power-supply voltage (high-level voltage) VDD as the bit line voltage VBLH to the bit line BL0. The first and third p-type transistors P1 and P3 are connected in series between the bit line BL0 and the non-select voltage generator VBLUGEN and transmit the non-select voltage VBLU as the bit line voltage VBLH to the bit line BL0.

Describing the above configuration in other words, the first and second n-type transistors N1 and N2 are connected in parallel with the first and second p-type transistors P1 and P2 between the bit line BL0 and the sense amplifier SA and the ground voltage VSS or the power-supply voltage VDD can be applied to the bit line BL0. The first and third n-type transistors N1 and N3 are connected in parallel with the first and third p-type transistors P1 and P3 between the bit line BL0 and the non-select voltage generator VBLUGEN and can apply the non-select voltage VBLU to the bit line BL0.

In this way, the second multiplexer MUX2 is connected between the first multiplexer MUX1_1 and the sense amplifier SA and transmits the ground voltage VSS or the non-select voltage VBLU as the bit line voltage VBLL to the first n-type transistor N1 or transmits the power-supply voltage VDD or the non-select voltage VBLU as the bit line voltage VBLH to the first p-type transistor P1. The first multiplexer MUX1_1 applies the bit line voltage VBLL from the second multiplexer MUX2 to the bit line BL0 via the first n-type transistor N1 or applies the bit line voltage VBLH from the second multiplexer MUX2 to the bit line BL0 via the first p-type transistor P1.

Basic configurations and functions of the CMOS pairs in the first multiplexers MUX1_1 to MUX1_4 corresponding to other bit lines BL1 to BL15 and the n-type MOS pairs and the p-type MOS pairs in the second multiplexer MUX2 are identical to those described above.

(Data Write Operation)

Figure 5:
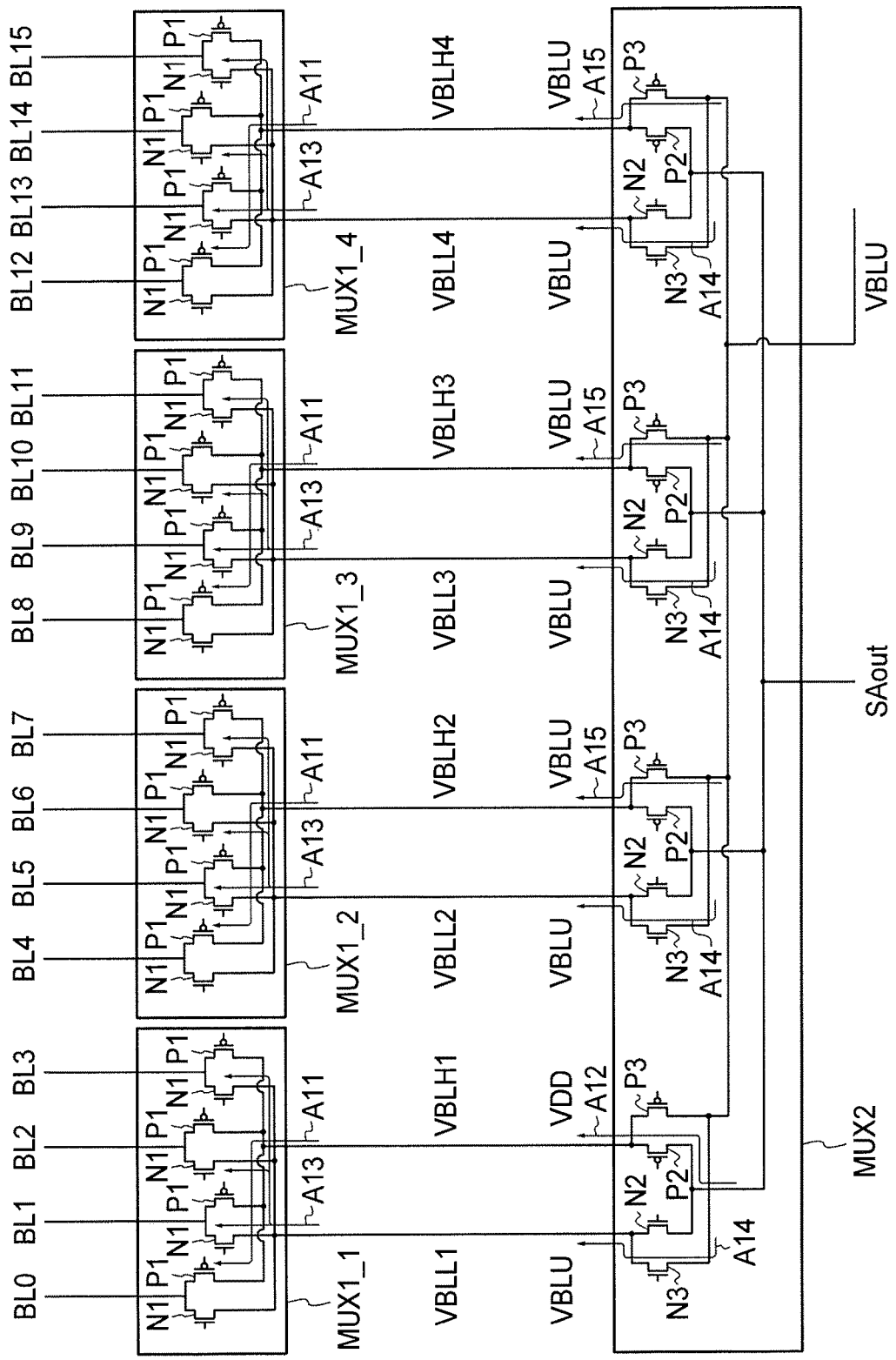
FIG. 5 is a circuit diagram illustrating a configuration example of the first multiplexers and the second multiplexer.

A data write operation of the memory chip 1 according to the present embodiment is explained next with reference to FIGS. 3 and 5. FIG. 5 is a circuit diagram illustrating a configuration example of the first multiplexers and the second multiplexer similarly to FIG. 3. However, FIG. 5 illustrates a write operation of the second logic while FIG. 3 illustrates a write operation of the first logic. It is assumed that the bit line BL0 is a selected bit line in a certain write operation. At this time, other bit lines BL1 to BL15 are non-selected bit lines.

(Write of First Logic)

In write of the first logic, the first multiplexers MUX1_1 to MUX1_4 apply the ground voltage VSS for writing the first logic from the sense amplifier SA to the selected bit line BL0 and apply the non-select voltage VBLU from the non-select voltage generator VBLUGEN to the non-selected bit lines BL1 to BL15.

In order to apply the ground voltage VSS to the selected bit line BL0, the first multiplexer MUX1_1 connects the bit line voltage VBLL1 to the selected bit line BL0. Therefore, the first n-type transistor N1 corresponding to the selected bit line BL0 is brought to an on-state and the first p-type transistor P1 corresponding to the selected bit line BL0 is brought to an off-state (see an arrow A1).

At this time, the second multiplexer MUX2 brings the second n-type transistor N2 corresponding to the bit line voltage VBLL1 to an on-state and brings the third n-type transistor N3 corresponding to the bit line voltage VBLL1 to an off-state. In this manner, the second multiplexer MUX2 applies the ground voltage VSS from the sense amplifier SA to the bit line voltage VBLL1 (see an arrow A2).

Meanwhile, in order to apply the non-select voltage VBLU to other non-selected bit lines BL1 to BL3 belonging to the same first multiplexer MUX1_1 as the selected bit line BL0 belongs to, the first multiplexer MUX1_1 connects the bit line voltage VBLH1 to the non-selected bit lines BL1 to BL3. Therefore, three first p-type transistors P1 corresponding to the non-selected bit lines BL1 to BL3 are brought to an on-state and three first n-type transistors N1 corresponding to the non-selected bit lines BL1 to BL3 are brought to an off-state (see an arrow A3).

At this time, the second multiplexer MUX2 brings the third p-type transistor P3 corresponding to the bit line voltage VBLH1 to an on-state and brings the second p-type transistor P2 corresponding thereto to an off-state (see an arrow A4). In this manner, the second multiplexer MUX2 applies the non-select voltage VBLU from the non-select voltage generator VBLUGEN to the bit line voltage VBLH1.

The first multiplexers MUX1_2 to MUX1_4 receive an address common to the first multiplexer MUX1_1 and operate in an identical manner to the first multiplexer MUX1_1. Therefore, the operations of the CMOS pairs corresponding to the bit lines BL4 to BL7 are identical to the operations of the CMOS pairs corresponding to the bit lines BL0 to BL3, respectively. The operations of the CMOS pairs corresponding to the bit lines BL8 to BL11 are also identical to the operations of the CMOS pairs corresponding to the bit lines BL0 to BL3, respectively. The operations of the CMOS pairs corresponding to the bit lines BL12 to BL15 are also identical to the operations of the CMOS pairs corresponding to the bit lines BL0 to BL3, respectively. In other words, the operations of the CMOS pairs corresponding to the bit lines BL0, BL4, BL8, and BL12 are the same. The operations of the CMOS pairs corresponding to the bit lines BL1, BL5, BL9, and BL13 are the same. The operations of the CMOS pairs corresponding to the bit lines BL2, BL6, BL10, and BL14 are the same. The operations of the CMOS pairs corresponding to the bit lines BL3, BL7, BL11, and BL15 are the same.

For example, in the above example, the first n-type transistors N1 corresponding to the selected bit line BL0 and the non-selected bit lines BL4, BL8, and BL12 are in an on-state and the first p-type transistors P1 corresponding thereto are in an off-state. The first n-type transistors N1 corresponding to other non-selected bit lines BL1 to BL3, BL5 to BL7, BL9 to BL11, and BL13 to BL15 are in an off-state and the first p-type transistors P1 corresponding thereto are in an on-state.

The non-selected bit lines BL5 to BL7, BL9 to BL11, and BL13 to BL15 in the first multiplexers MUX1_2 to MUX1_4 are connected to the high-voltage-side bit line voltages VBLH2 to VBLH4, respectively, similarly to the non-selected bit lines BL1 to BL3 in the first multiplexer MUX1_1. Therefore, it suffices that the second multiplexer MUX2 applies the non-select voltage VBLU to the bit line voltages VBLH2 to VBLH4 similarly to the bit line voltage VBLH1. That is, it suffices that the second multiplexer MUX2 brings the third p-type transistors P3 corresponding to the bit line voltages VBLH2 to VBLH4 to an on-state and brings the second p-type transistors P2 corresponding thereto to an off-state, similarly to the p-type CMOS pair corresponding to the bit line voltage VBLH1.

However, although being the non-selected bit lines, the bit lines BL4, BL8, and BL12 are connected to the low-level-side bit line voltages VBLL2 to VBLL4, respectively, similarly to the selected bit line BL0. Therefore, the second multiplexer MUX2 needs to apply the non-select voltage VBLU instead of the bit line voltage VBLL1 (the ground voltage VSS) to the bit line voltages VBLL2 to VBLL4.

Accordingly, the second multiplexer MUX2 brings the third n-type transistors N3 corresponding to the bit line voltages VBLL2 to VBLL4 to an on-state and brings the second n-type transistors N2 corresponding to the bit line voltages VBLL2 to VBLL4 to an off-state (see an arrow A5). In this manner, the second multiplexer MUX2 applies the non-select voltage VBLU from the non-select voltage generator VBLUGEN to the bit line voltages VBLL2 to VBLL4.

As described above, the first multiplexers MUX1_1 to MUX1_4 operate in the same manner. Meanwhile, the second multiplexer MUX2 sets only the bit line voltage VBLL1 corresponding to the first multiplexer MUX1_1 connected to the selected bit line BL0 to the ground voltage VSS as the write voltage from the sense amplifier SA, and sets the bit line voltages VBLH1 to VBLH4 and VBLL2 to VBLL4 corresponding to other non-selected bit lines BL1 to BL15 to the non-select voltage VBLU from the non-select voltage generator VBLUGEN.

(Write of Second Logic)

In write of the second logic, the first multiplexers MUX1_1 to MUX1_4 apply the power-supply voltage VDD for writing the second logic from the sense amplifier SA to the selected bit line BL0 and apply the non-select voltage VBLU from the non-select voltage generator VBLUGEN to the non-selected bit lines BL1 to BL15.

In order to apply the power-supply voltage VDD to the selected bit line BL0, the first multiplexer MUX1_1 connects the bit line voltage VBLH1 to the selected bit line BL0. Therefore, the first p-type transistor P1 corresponding to the selected bit line BL0 is brought to an on-state and the first n-type transistor N1 corresponding to the selected bit line BL0 is brought to an off-state (see an arrow A11).

At this time, the second multiplexer MUX2 brings the second p-type transistor P2 corresponding to the bit line voltage VBLH1 to an on-state and brings the third p-type transistor P3 corresponding to the bit line voltage VBLH1 to an off-state. In this manner, the second multiplexer MUX2 applies the power-supply voltage VDD from the sense amplifier SA to the bit line voltage VBLH1 (see an arrow A12).

Meanwhile, in order to apply the non-select voltage VBLU to the non-selected bit lines BL1 to BL3 belonging to the same first multiplexer MUX1_1 as the selected bit line BL0 belongs to, the first multiplexer MUX1_1 connects the bit line voltage VBLL1 to the non-selected bit lines BL1 to BL3. Therefore, three first n-type transistors N1 corresponding to the non-selected bit lines BL1 to BL3 are brought to an on-state and three first p-type transistors P1 corresponding to the non-selected bit lines BL1 to BL3 are brought to an off-state (see an arrow A13).

At this time, the second multiplexer MUX2 brings the third n-type transistor N3 corresponding to the bit line voltage VBLL1 to an on-state and brings the second n-type transistor N2 corresponding thereto to an off-state (see an arrow A14). In this manner, the second multiplexer MUX2 applies the non-select voltage VBLU from the non-select voltage generator VBLUGEN to the bit line voltage VBLL1.

As described above, the first multiplexers MUX1_2 to MUX1_4 receive an address common to the first multiplexer MUX1_1 and operate in an identical manner thereto. For example, in the above example, the first p-type transistors P1 corresponding to the selected bit line BL0 and the non-selected bit lines BL4, BL8, and BL12 are in an on-state and the first n-type transistors N1 corresponding thereto are in an off-state. The first p-type transistors P1 corresponding to other non-selected bit lines BL1 to BL3, BL5 to BL7, BL9 to BL11, and BL13 to BL15 are in an off-state and the first n-type transistors N1 corresponding thereto are in an on-state.

In this case, the non-selected bit lines BL5 to BL7, BL9 to BL11, and BL13 to BL15 in the first multiplexers MUX1_2 to MUX1_4 are connected to the low-voltage-side bit line voltages VBLL2 to VBLL4, respectively, similarly to the non-selected bit lines BL1 to BL3 in the first multiplexer MUX1_1. Therefore, it suffices that the second multiplexer MUX2 applies the non-select voltage VBLU to the bit line voltages VBLL2 to VBLL4 similarly to the bit line voltage VBLL1. That is, it suffices that the second multiplexer MUX2 brings the third n-type transistors N3 corresponding to the bit line voltages VBLL2 to VBLL4 to an on-state and brings the second n-type transistors N2 corresponding thereto to an off-state, similarly to the n-type CMOS pair corresponding to the bit line voltage VBLL1.

However, although being the non-selected bit lines, the bit lines BL4, BL8, and BL12 are connected to the high-level-side bit line voltages VBLH2 to VBLH4, respectively, similarly to the selected bit line BL0. Therefore, the second multiplexer MUX2 needs to apply the non-select voltage VBLU different from the bit line voltage VBLH1 (the power-supply voltage VDD) to the bit line voltages VBLH2 to VBLH4.

Accordingly, the second multiplexer MUX2 brings the third p-type transistors P3 corresponding to the bit line voltages VBLH2 to VBLH4 to an on-state and brings the second p-type transistors P2 corresponding thereto to an off-state (see an arrow A15). In this manner, the second multiplexer MUX2 applies the non-select voltage VBLU from the non-select voltage generator VBLUGEN to the bit line voltages VBLH2 to VBLH4.

In this way, the first multiplexers MUX1_1 to MUX1_4 operate similarly. Meanwhile, the second multiplexer MUX2 sets only the bit line voltage VBLH1 corresponding to the first multiplexer MUX1_1 connected to the selected bit line BL0 to the power-supply voltage VDD as the write voltage from the sense amplifier SA, and sets the bit line voltages VBLL1 to VBLL4 and VBLH2 to VBLH4 corresponding to other non-selected bit lines BL1 to BL15 to the non-select voltage VBLU from the non-select voltage generator VBLUGEN.

As described above, the column decoder CD can apply the write voltage (VSS or VDD) to the selected bit line BL0. Meanwhile, the row decoder RD applies an arbitrary write voltage to a selected word line WL. This enables a voltage difference to be applied to a selected memory cell MC to write data of desired logic to the selected memory cell MC without non-selected memory cells being disturbed. Of course, the selected bit line can be any bit line among the bit lines BL0 to BL15.

In the memory chip 1 according to the present embodiment, the first multiplexers MUX1_1 to MUX1_4 each have one CMOS pair for each of relevant bit lines BL. That is, in each of the first multiplexers MUX1_1 to MUX1_4, it suffices that two transistors N1 and P1 corresponding to the bit line voltages VBLL and VBLH, respectively, are provided for each of the relevant bit lines BL. The reason why the first multiplexers MUX1_1 to MUX1_4 can have such a simple configuration is that the second multiplexer MUX2 can apply the non-select voltage VBLU to both the bit line voltages VBLL and VBLH. For example, when the bit line VBLL1 transmits the ground voltage VSS as in FIG. 3, the bit line VBLH1 can transmit the non-select voltage VBLU. When the bit line VBLH1 transmits the power-supply voltage VDD as in FIG. 5, the bit line VBLL1 can transmit the non-select voltage VBLU. Accordingly, the first multiplexers MUX1_1 to MUX1_4 do not need to input the non-select voltage VBLU separately from the second multiplexer MUX2.

If the first multiplexers MUX1_1 to MUX1_4 input the non-select voltage VBLU separately from the second multiplexer MUX2, the first multiplexers MUX1_1 to MUX1_4 need transistors for switching the non-select voltage VBLU in addition to the CMOS pairs. This means that the first multiplexers MUX1_1 to MUX1_4 have at least three transistors for each of the bit lines BL0 to BL15. As described above, the distance between adjacent bit lines is considerably narrowed with downscaling of the elements, and the number of the bit lines is also large. Therefore, if the number of transistors provided for each of the bit lines BL is increased, the placement area of the first multiplexers MUX1_1 to MUX1_4 is increased, which hinders the downscaling.

In contrast thereto, in the memory chip 1 according to the present embodiment, the first multiplexers MUX1_1 to MUX1_4 directly connected to the bit lines BL0 to BL15 include only a minimum number of (that is, two) transistors N1 and P1 for each bit line BL. Therefore, the placement area of the first multiplexers MUX1_1 to MUX1_4 according to the present embodiment is small and is unlikely to hinder downscaling of the memory chip 1. As a result, the memory chip 1 according to the present embodiment can reduce the placement area of the multiplexers between the bit lines BL and the sense amplifier SA.

The bit lines BL0 to BL15 are sometimes connected in common to drains of the transistors that constitute the first multiplexers MUX1_1 to MUX1_4. In this case, at least three transistors are placed in tandem along each of the bit lines BL0 to BL15. In this case, the lengths of the bit lines BL0 to BL15 are increased, which leads to an increase in the parasitic capacitance of the bit lines.

In contrast thereto, in the memory chip 1 according to the present embodiment, only a minimum number of (that is, two) transistors N1 and P1 are placed with respect to each of the bit lines BL0 to BL15. Therefore, even when these transistors N1 and P1 are placed in a tandem manner along each of the bit lines BL0 to BL15, the lengths of the bit lines BL0 to BL15 are not increased so much. Furthermore, because the number of transistors connected to each of the bit lines BL0 to BL15 is reduced, the parasitic capacitance of the bit lines BL0 to BL15 can be reduced as much as possible. This leads to speed-up of a write operation and a read operation.

(Consideration on VSS, VDD, and VBLU)

A condition on the magnitudes of the voltages VSS, VDD, and VBLU is explained next. Assuming the high-level power-supply voltage VDD as the second voltage is an upper limit, the n-type transistors N1 to N3 can transmit only a voltage equal to or lower than VDD-Vtn. Vtn is a threshold voltage of the n-type transistors N1 to N3. If a voltage above VDD-Vtn is applied to the drains, the n-type transistors N1 to N3 are brought to an off-state.

Assuming the low-level power-supply voltage VSS as the first voltage is a lower limit, the p-type transistors P1 to P3 can transmit only a voltage equal to or higher than VSS+|Vtp|. Vtp is a threshold voltage of the p-type transistors P1 to P3. If a voltage below VSS+|Vtp| is applied to the drains, the p-type transistors P1 to P3 are brought to an off-state.

Therefore, when applied to a bit line BL, a relatively low ground voltage VSS is preferably caused to pass through the n-type transistors N1 to N3. On the other hand, a relatively high power-supply voltage VDD is preferably caused to pass through the p-type transistors P1 to P3 when applied to a bit line BL.

Furthermore, the non-select voltage VBLU needs to meet the following expression 1.

$$VSS+|Vtp|<VBLU<VDD-Vtn \qquad \text{(Expression 1)}$$

In FIG. 3, the non-selected bit lines BL1 to BL3, BL5 to BL7, BL9 to BL11, and BL13 to BL15 receive the non-select voltage VBLU via the third p-type transistor P3 and the first p-type transistor P1. On the other hand, in FIG. 5, the non-selected bit lines BL4, BL8, and BL12 corresponding to the selected bit line BL0 in the first multiplexers MUX1_2 to MUX1_4, respectively, receive the non-select voltage VBLU via the third p-type transistor P3 and the first p-type transistor P1. That is, when the ground voltage VSS is applied to the selected bit line BL0, the non-select voltage VBLU is applied to the non-selected bit lines via the p-type transistors P1 and P3. When the power-supply voltage VDD is applied to the selected bit line BL0, the non-select voltage VBLU is applied to bit lines via the p-type transistors P1 and P3.

Whether the non-select voltage VBLU is applied via the p-type transistors P1 and P3 or is applied via the n-type transistors N1 and N3, the non-select voltage VBLU needs to meet the expression 1.

In order to suppress disturbance to non-selected memory cells, the non-select voltage VBLU is sometimes set to be deviated from a median (0.5 VDD, for example) between the ground voltage VSS (0 volt, for example) and the power-supply voltage VDD in consideration of the voltage of non-selected word lines. For example, the non-select voltage VBLU is sometimes set to a value between 0.2 VDD and 0.8 VDD.

If the non-select voltage VBLU is 0.8 VDD and is above VDD-Vtn, there is a risk that the n-type transistors N3 and N1 are brought to an off-state before reaching 0.8 VDD. In this case, the non-selected bit lines BL1 to BL3, BL5 to BL7, BL9 to BL11, and BL13 to BL15 in FIG. 5 do not rise to 0.8 VDD because the non-select voltage VBLU is applied via the n-type transistors N3 and N1. Accordingly, there is a possibility that a voltage difference occurs between non-selected bit lines and non-selected word lines and that disturbance occurs in non-selected memory cells.

If the non-select voltage VBLU is 0.2 VDD and is below VSS+|Vtp|, there is a risk that the p-type transistors P3 and P1 are brought to an off-state before reaching 0.2 VDD. In this case, the non-selected bit lines BL1 to BL3, BL5 to BL7, BL9 to BL11, and BL13 to BL15 in FIG. 3 do not fall to 0.2 VDD because the non-select voltage VBLU is applied via the p-type transistors P3 and P1. Accordingly, there is a possibility that a voltage difference occurs between non-selected bit lines and non-selected word lines and that disturbance occurs in non-selected memory cells.

Therefore, in order to prevent data in the non-selected memory cells MC from being degraded, it is preferable that the non-select voltage VBLU meet the expression 1. The non-select voltage VBLU meeting the expression 1 can suppress degradation (disturbance) of the data in the non-selected memory cells MC.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a memory cell array;
a plurality of bit lines connected to the memory cell array;
a plurality of word lines connected to the memory cell array;
a sense amplifier configured to read data from memory cells in the memory cell array or write data to the memory cells via the bit lines, the sense amplifier selectively applying a first voltage for writing a first logic and a second voltage for wiring a second logic;
a non-select voltage generator configured to generate a non-select voltage for not writing data; and
a decoder configured to transfer the first voltage or the second voltage from the sense amplifier to a first bit line selected from the bit lines, and transfer the non-select voltage to other bit lines, when writing the first logic or the second logic to a memory cell connected to the first bit line,
wherein the decoder includes
a plurality of first multiplexers each comprising
a first n-type transistor connected between a corresponding one of the bit lines and a first node, and
a first p-type transistor connected between the corresponding one of the bit lines and a second node, and
a second multiplexer comprising
a second n-type transistor connected between the first nodes and the sense amplifier,
a second p-type transistor connected between the second nodes and the sense amplifier,
a third n-type transistor connected between the first nodes and the non-select voltage generator, and
a third p-type transistor connected between the second nodes and the non-select voltage generator.

2. The device of claim 1, wherein
in a data write operation,
the first n-type transistor and the first p-type transistor operate complementarily with each other,
the second n-type transistor and the third n-type transistor operate complementarily with each other, and
the second p-type transistor and the third p-type transistor operate complementarily with each other.

3. The device of claim 2, wherein the non-select voltage is a voltage between the first voltage and the second voltage.

4. The device of claim 2, wherein
assuming the first voltage is a low-level power-supply voltage VSS, the second voltage is a high-level power-supply voltage VDD, a threshold voltage of the first to third n-type transistors is Vtn, and a threshold voltage of the first to third p-type transistors is Vtp,
the non-select voltage VBLU meets an expression 1

$$VSS+|Vtp|<VBLU<VDD-Vtn \qquad \text{(Expression 1)}.$$

5. The device of claim 2, wherein
the first and second n-type transistors are connected in series between the first bit line and the sense amplifier,
the first and third n-type transistors are connected in series between the first bit line and a non-select voltage generator configured to generate the non-select voltage,
the first and second p-type transistors are connected in series between the first bit line and the sense amplifier, and
the first and third p-type transistors are connected in series between the first bit line and the non-select voltage generator.

6. The device of claim 5, wherein
the first and second n-type transistors are connected in parallel with the first and second p-type transistors between the first bit line and the sense amplifier, and
the first and third n-type transistors are connected in parallel with the first and third p-type transistors between the first bit line and the non-select voltage generator.

7. The device of claim 1, wherein the non-select voltage is a voltage between the first voltage and the second voltage.

8. The device of claim 1, wherein
assuming the first voltage is a low-level power-supply voltage VSS, the second voltage is a high-level power-supply voltage VDD, a threshold voltage of the first to third n-type transistors is Vtn, and a threshold voltage of the first to third p-type transistors is Vtp,
the non-select voltage VBLU meets an expression 1

$$VSS+|Vtp|<VBLU<VDD-Vtn \qquad \text{(Expression 1).}$$

9. The device of claim 1, wherein
the first and second n-type transistors are connected in series between the first bit line and the sense amplifier,
the first and third n-type transistors are connected in series between the first bit line and the non-select voltage generator configured to generate the non-select voltage,
the first and second p-type transistors are connected in series between the first bit line and the sense amplifier, and
the first and third p-type transistors are connected in series between the first bit line and the non-select voltage generator.

10. The device of claim 9, wherein
the first and second n-type transistors are connected in parallel with the first and second p-type transistors between the first bit line and the sense amplifier, and
the first and third n-type transistors are connected in parallel with the first and third p-type transistors between the first bit line and the non-select voltage generator.

11. The device of claim 1, wherein
the memory cell array is a cross-point memory cell array including ReRAMs (Resistive RAMs).

12. The device of claim 1, wherein
when writing the first logic to the memory cell connected to the first bit line among the bit lines,
in a state where
the sense amplifier applies the first voltage,
the second n-type transistor is turned on,
the second p-type transistor is turned off,
the third n-type transistor is turned off, and
the third p-type transistor is turned on,
the first n-type transistor connected to the first bit line is turned on,
the first p-type transistor connected to the first bit line is turned off,
the first n-type transistors connected to the other bit lines are turned off, and
the first p-type transistors connected to the other bit lines are turned on, and
when writing the second logic to the memory cell connected to the first bit line among the bit lines,
in a state where
the sense amplifier applies the second voltage,
the second n-type transistor is turned off,
the second p-type transistor is turned on,
the third n-type transistor is turned on, and
the third p-type transistor is turned off,
the first n-type transistor connected to the first bit line is turned off,
the first p-type transistor connected to the first bit line is turned on,
the first n-type transistors connected to the other bit lines are turned on, and
the first p-type transistors connected to the other bit lines are turned off.

* * * * *